(12) United States Patent
Pipes et al.

(10) Patent No.: US 7,061,068 B2
(45) Date of Patent: Jun. 13, 2006

(54) SHALLOW TRENCH ISOLATION STRUCTURES HAVING UNIFORM AND SMOOTH TOPOGRAPHY

(75) Inventors: Leonard C. Pipes, Beaverton, OR (US); Rita Slilaty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 109 days.

(21) Appl. No.: 10/764,751

(22) Filed: Jan. 26, 2004

(65) Prior Publication Data

US 2004/0155341 A1 Aug. 12, 2004

Related U.S. Application Data

(62) Division of application No. 10/285,109, filed on Oct. 31, 2002, now Pat. No. 6,713,385.

(51) Int. Cl.
*H01L 29/00* (2006.01)

(52) U.S. Cl. ............... 257/510; 257/E21.546

(58) Field of Classification Search ........... 438/221, 438/296, 359, 424, 449, 527, 528, 692, 924; 257/E21.54, E21.546, 510, 751, 752
See application file for complete search history.

(56) References Cited

U.S. PATENT DOCUMENTS

| | | | | |
|---|---|---|---|---|
| 5,616,513 A | * | 4/1997 | Shepard | 438/402 |
| 5,795,801 A | * | 8/1998 | Lee | 438/199 |
| 5,902,127 A | * | 5/1999 | Park | 438/435 |
| 6,139,697 A | * | 10/2000 | Chen et al. | 204/192.15 |
| 6,146,973 A | * | 11/2000 | He et al. | 438/433 |
| 6,218,303 B1 | * | 4/2001 | Lin | 438/687 |
| 6,297,147 B1 | * | 10/2001 | Yang et al. | 438/627 |
| 6,337,256 B1 | * | 1/2002 | Shim | 438/435 |
| 6,534,865 B1 | * | 3/2003 | Lopatin et al. | 257/751 |
| 6,541,351 B1 | * | 4/2003 | Bartlau et al. | 438/426 |
| 6,569,739 B1 | * | 5/2003 | Kamath et al. | 438/270 |
| 6,642,109 B1 | * | 11/2003 | Lee et al. | 438/257 |
| 6,653,201 B1 | * | 11/2003 | Chung | 438/424 |
| 6,737,321 B1 | * | 5/2004 | Lee | 438/264 |
| 6,770,523 B1 | * | 8/2004 | Sahota et al. | 438/221 |
| 2002/0100952 A1 | * | 8/2002 | Hong | 257/510 |
| 2003/0045098 A1 | * | 3/2003 | Verhaverbeke et al. | 438/689 |
| 2003/0045131 A1 | * | 3/2003 | Verbeke et al. | 438/795 |

* cited by examiner

*Primary Examiner*—Michael Lebentritt
*Assistant Examiner*—Stanetta Isaac
(74) *Attorney, Agent, or Firm*—Trop, Pruner & Hu, P.C.

(57) ABSTRACT

Ions are implanted into the dielectric layer and/or barrier layer over a semiconductor substrate to change the polish rates of either or both layers during formation of a shallow trench isolation (STI) structure. The ion implantation can change or affect the polish rates of the material and the polish selectivity, and reduce or minimize unwanted topography resulting from chemical mechanical polishing (CMP). After CMP, the resulting STI structure has a more uniform and smooth topography.

6 Claims, 3 Drawing Sheets

SHALLOW TRENCH ISOLATION STRUCTURES HAVING UNIFORM AND SMOOTH TOPOGRAPHY

This is a divisional of prior application Ser. No. 10/285,109, filed Oct. 31, 2002 now U.S. Pat. No. 6,713,385.

BACKGROUND

The present invention relates generally to the field of integrated circuit manufacturing, and more specifically, to methods and structures for providing isolation between circuit elements.

Advances in semiconductor manufacturing technology have led to the integration of millions of transistors onto a single integrated circuit (IC). In order to reach these levels of integration, all the elements that go into such an IC must be shrunk. It is desirable to reduce the size of the transistors and interconnect lines that make up the bulk of an integrated circuit. However, modern metal-oxide semiconductor (MOS) integrated circuits have also addressed the design and implementation of isolation structures to increase the density of ICs.

The state of the art isolation scheme in manufacturing integrated circuits is shallow trench isolation (STI), in which shallow dielectric trenches electrically separate neighboring transistors. For example, STI is a preferred isolation structure for 0.25 micron and smaller topographies. To form an STI structure, trenches are made by etching the silicon substrate, filling the trench with dielectric material such as silicon oxide, and planarization of the substrate by chemical mechanical polishing (CMP). An underlying nitride layer may be used as a barrier and/or hard stop to CMP.

To ensure that all of the dielectric material is removed by CMP, or because of non-uniformity in the thickness of the dielectric layer, a certain amount of over-polish may be continued after the underlying barrier layer is reached. The polish rate of dielectric material such as silicon oxide typically is significantly faster than that of the nitride or other barrier layer, so unwanted topography may result from the over-polishing. For example, the difference between oxide and nitride polish rates may lead to dishing in the surface of the dielectric layer and/or roughening the surface of the dielectric layer.

Another inherent problem in polishing patterned oxides with an underlying barrier layer is that the die pattern itself also affects the polish rate. This is due to the fact that some local areas of the die pattern may have a little oxide surrounded by a lot of nitride, so that region of the die pattern assumes the polish characteristics of the nitride, whereas in other areas of the pattern the opposite can occur.

The result is different polish characteristics within the same die, resulting in within-die topographical non-uniformity that can be a problem during patterning processes later in the process flow. This may adversely influence the objective of creating a smooth topography needed for subsequent overlying insulator and conductor structures, compromise the isolation performance of the STI, and cause leakage current across devices adjacent the STI structure.

Efforts have been made to reduce within-die variation due to pattern density. For example, specific design rules may be used to reduce within-die variation, and optimal within-die thickness profiles may be determined through process experimentation. Additionally, nitride "dummy structures" have been placed within the die, particularly in large open isolation regions, in efforts to minimize the local area over-polish due to the higher removal rates of oxide or other dielectric.

However, there remains a need for an STI structure that reduces or eliminates unwanted topography in the STI structure, improves the STI isolation performance, reduces the probability of leakage current across devices adjacent the STI structure, and provides a smoother topography for subsequent overlying insulator and conductor structures.

DETAILED DESCRIPTION

Figure 1:
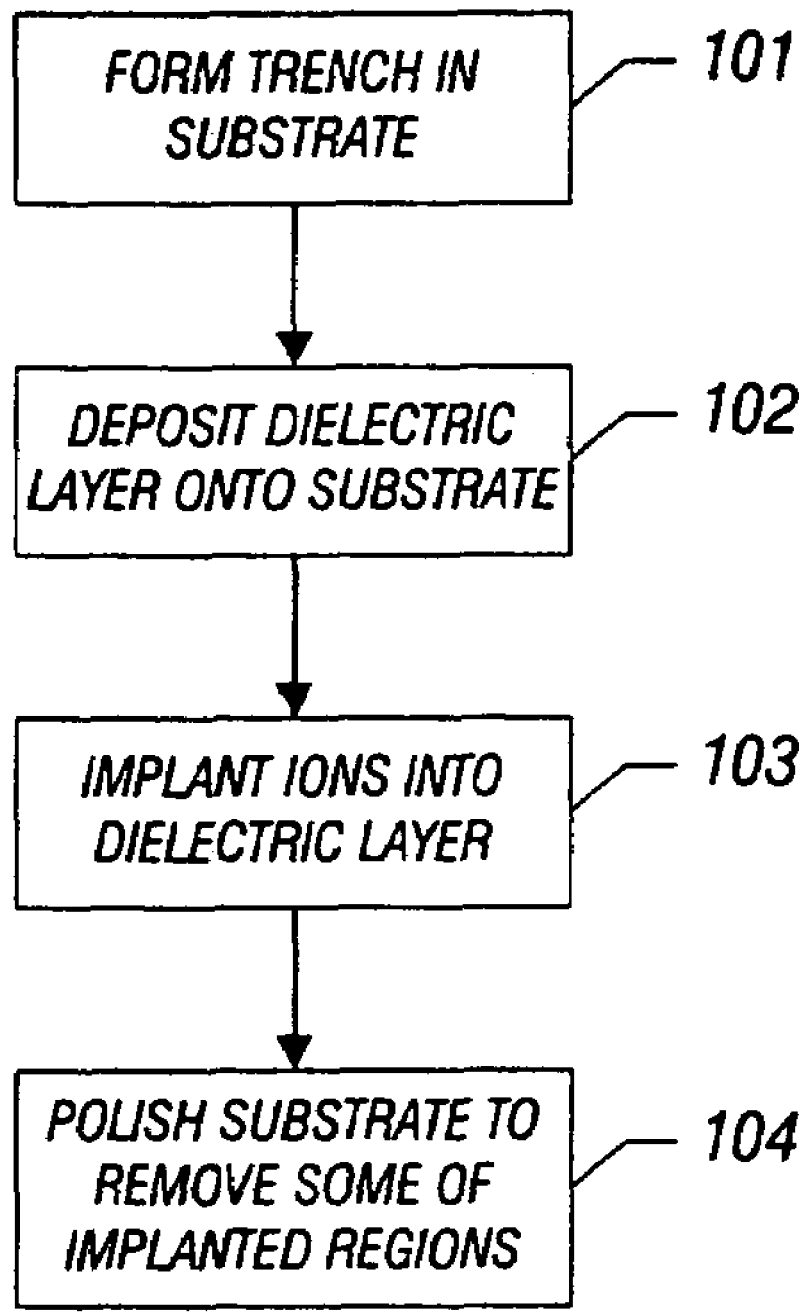
FIG. 1 illustrates, in the form of a flow diagram, a method of forming shallow trench isolation (STI) structures in accordance with one embodiment of the present invention.

FIG. 1 illustrates, in the form of a flow diagram, a method in accordance with one embodiment of the present invention. In block 101, a trench is formed in a semiconductor substrate surface. To form the trench, a patterned masking layer may be formed over the surface of a silicon substrate, the pattern having openings which expose portions of the underlying substrate. For example, the patterned masking layer may include a nitride barrier layer over a pad oxide. The exposed portions of the substrate are etched, typically in a plasma etcher, to form trenches. The trenches also may be thought of as recesses in the surface of the substrate.

In block 102, a dielectric layer, also referred to as a bulk material, typically an oxide of silicon, may be deposited over the substrate and partially or completely fill the trench. For example, the dielectric layer may be formed by high density plasma chemical vapor deposition (HDPCVD).

In block 103, ions are implanted into the dielectric layer. The ions may be dopants or chemically neutral species. The particular dopant or species, depth and concentration may be selected depending on the desired CMP polish rate and/or polish selectivity. Polish selectivity refers to the relative polish rate of different materials being removed simultaneously. Ion implantation will affect different materials' polish rates differently, so the polish selectivity of those materials may be modified.

In block 104, CMP is performed to planarize the surface of the structure. During CMP, the dielectric and some of the implanted regions may be polished away and removed. The CMP polish rates of the dielectric may be affected by the ion implantation. In general, ion implantation that is performed after deposition of the dielectric layer can increase the polish rate of the dielectric.

Figure 2:
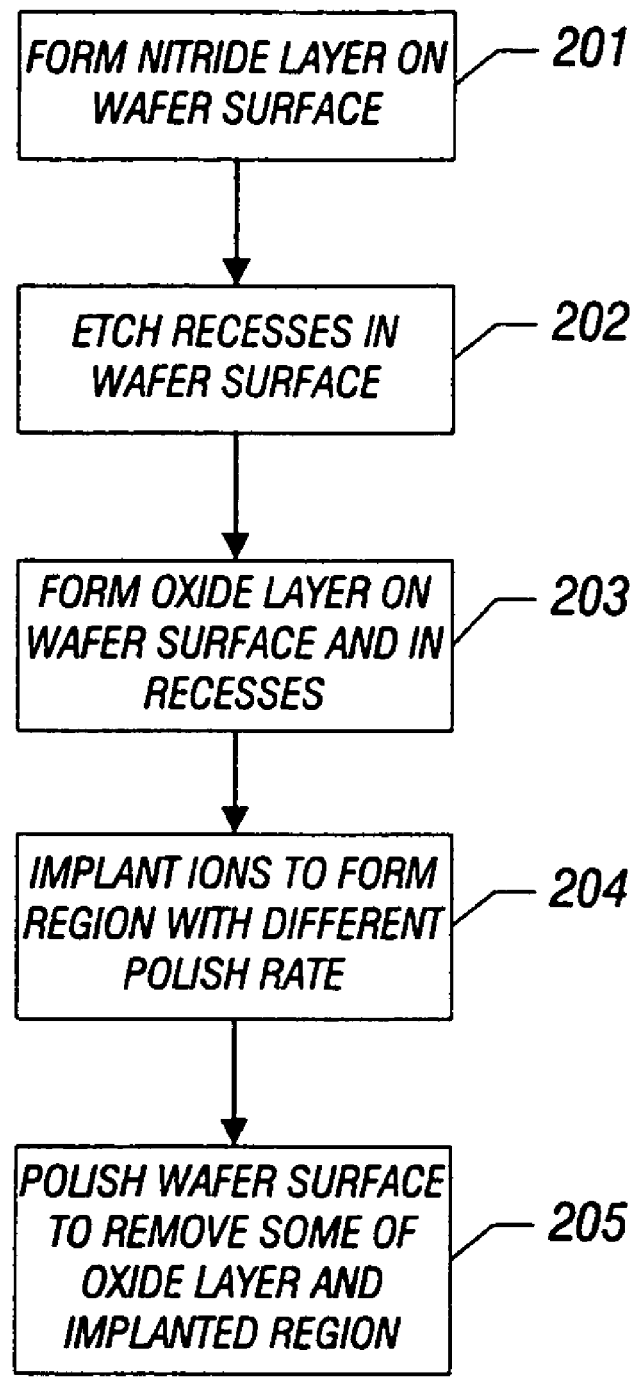
FIG. 2 is a flow diagram of a method of forming STI structures according to an embodiment of the invention.

FIG. 2 shows a flow diagram according to an embodiment of the invention in which the semiconductor substrate has a nitride barrier layer. In block 201, a nitride layer is formed on the wafer surface. The nitride layer has a first polish rate. Optionally, ions may be implanted into the nitride layer at this stage of the process to form a region with a polish rate different from the nitride polish rate. In block 202, recesses are etched in the wafer surface. In block 203, an oxide layer is formed on the wafer surface and in the recesses. The oxide layer has a second polish rate. In block 204, ions are implanted into the oxide layer to form a region with a third polish rate different from the oxide or nitride polish rates. In block 205, the wafer surface is polished to remove at least some of the oxide layer and the implanted region.

For structures that include a nitride layer, as shown in the flow diagram of FIG. 2, ion implantation into the dielectric layer will increase the polish rate of the dielectric layer more than the polish rate of the barrier layer, effectively increasing the oxide/nitride polish selectivity. Alternatively, if ion implantation is performed after formation of the patterned masking layer, but before formation of trenches in the substrate, ion implantation may affect the CMP polish rate of the barrier layer without affecting the polish rate of the dielectric layer. Ion implantation prior to formation of trenches can increase the nitride polish rate, effectively reducing the oxide/nitride polish selectivity.

The choice of ions to be implanted to form doped regions in the dielectric and/or barrier layer may be, but are not limited to, silicon, carbon, nitrogen, or oxygen. The species, dosage and energy of the ion implantation can affect the CMP polish rate and polish selectivity. For example, it was found that polish rates can vary significantly with dosage rates.

A test was performed to compare CMP polish rates for different ion implantation dosage rates into high-density plasma (HDP) oxide with a thickness of 6000 Å. In the following examples, the numerical values for the dosages are given in scientific notation, where E represents the base ten and the numeral following E represents the exponent of base ten.

Without ion implantation, the CMP polish rate was 1021 Å/minute in the region of the wafer within 122 mm of the wafer center. After silicon ions were implanted into the HDP oxide, at a dose of $2.0E15$ ions/cm$^2$ with an energy of 80 keV, the CMP polish rate was 1283 Å/minute in the same region of the wafer. Silicon ions also were implanted into the HDP oxide, at a dose of $6.0E15$ ions/cm$^2$ with an energy of 80 keV, and the CMP polish rate was 1210 Å/minute. Thus, ion implanted regions were found to have polish rates different from pre-implanted regions.

In accordance with one embodiment of the invention, ion implantation dosages generally may be between approximately $1.0E15$ and $5.0E16$ ions/cm$^2$, and the energy may be between approximately 5 keV and 80 keV.

Figure 3A:
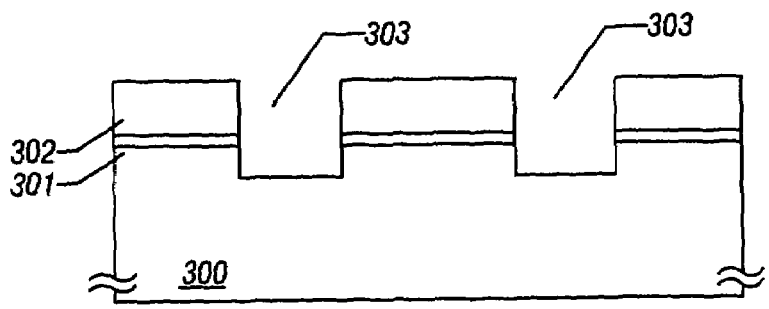
FIGS. 3a–3d illustrate a cross-sectional view of a portion of a semiconductor substrate that may result after certain steps are used to make STI structures in accordance with one embodiment of the present invention.

FIGS. 3a–3d show cross sections of structures that result after using certain steps according to one embodiment of the invention in which STI structures are formed in a semiconductor substrate. FIG. 3a shows a partially processed semiconductor wafer in which trenches 303 are formed as recesses in substrate 300. Substrate 300 may be any surface, generated when making an integrated circuit, upon which one or multiple conductive layers and/or devices may be formed.

In FIG. 3a, oxide pad layer 301 may be formed on the substrate by thermal oxidation or chemical vapor deposition. Its major function is to serve as a pad for barrier layer 302 which may be silicon nitride or other masking material. The pad oxide 301 typically is about 100 Å thick and nitride barrier layer 302 is about 900 to 1400 Å thick. The nitride barrier layer 302 serves as a mask to protect the active regions when trenches 303 are formed in the substrate by etching or other processes. The trench regions are etched to a depth of approximately 2000 to 5000 Å.

Figure 3B:
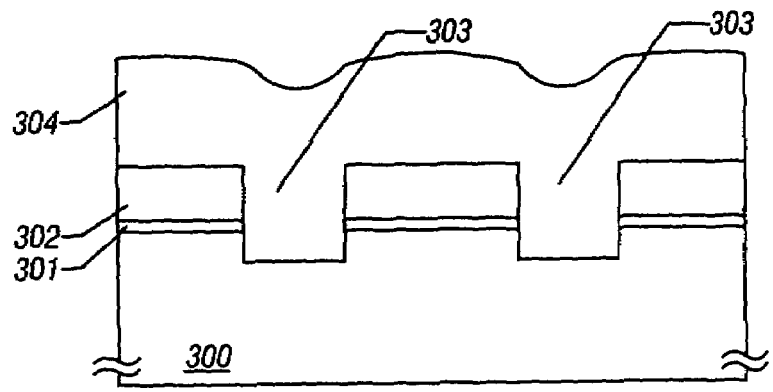

As shown in FIG. 3b, a partially processed semiconductor wafer is shown after the dielectric layer 304 is deposited over the substrate and fills up the trench regions. The thickness of the deposited dielectric layer may be between approximately 2000 and 20,000 Å. This dielectric layer is typically an oxide of silicon that may be formed by high density plasma chemical vapor deposition (HDPCVD), plasma enhanced chemical vapor deposition (PECVD), or similar processes. Although preferably made of silicon dioxide, dielectric layer may be made from other bulk materials that may insulate one conductive layer from another, including organic polymers selected from the group that includes polyimides, parylenes, polyartylethers, polynaphthalenes, polyquinolines, or copolymers thereof.

Figure 3C:
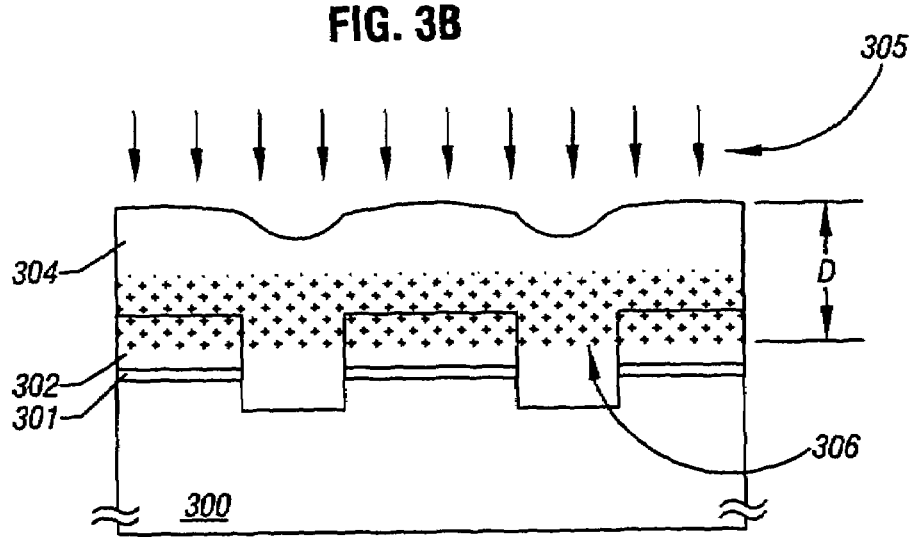

As shown in FIG. 3c, a partially processed semiconductor wafer is shown in cross section according to one embodiment of the invention, in which ion implantation 305 is performed to place ions 306, i.e., dopants and/or chemically neutral species, in dielectric layer 304 and barrier layer 302. The ion implantation into the dielectric layer may be to a depth D that is at or near the level of the barrier layer. The ion implantation is at a sufficient depth and of a sufficient concentration to affect the polish rate of the dielectric layer and/or barrier layer into which the implantation is made, and may damage the dielectric and/or the barrier layer. Thus, the implanted region has a polish rate that is different from the polish rates of the pre-implanted dielectric layer and/or barrier layer.

In another embodiment of the invention, ion implantation may be performed into the barrier layer before the trenches are etched into the substrate and before the deposition of dielectric material. In this embodiment, the ion implantation affects the polish rate of only the barrier layer rather than the dielectric layer.

Figure 3D:
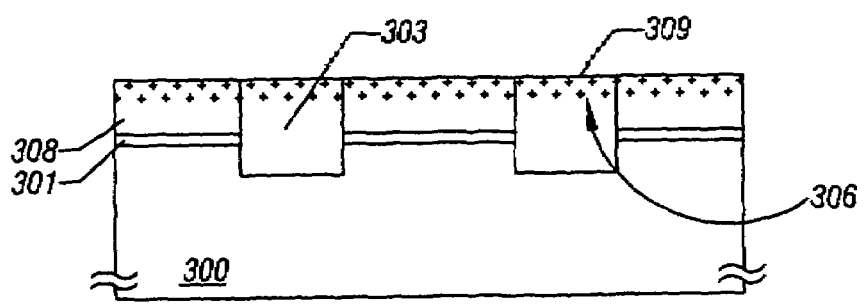

FIG. 3d shows a partially processed semiconductor wafer 300 in cross section, after CMP is used to polish and planarize the semiconductor wafer to surface 309. To assure removal of the dielectric except that which is remaining inside trench regions 303, some over-polish may be performed. During the removal of dielectric, the implanted ion regions also may be partially or completely removed. The overpolish also may remove some of the barrier layer including regions with implanted ions. The remaining barrier layer 308 may have a reduced thickness. In one embodiment, material with ions implanted above surface 309 will be removed by CMP, and material with ions implanted deeper than surface 309 will not be removed by CMP.

Ion implantation may affect the CMP polish rate and polish selectivity of the material(s) into which the ions are implanted, i.e., the dielectric material and/or the barrier layer. The magnitude of the effect is a function of the dopant species implanted, the interaction between the implanted species, species dose, concentration, depth, and the bulk material into which the ions are implanted. Ion implantation affects different materials' polish rates differently, so the relative polish rates, i.e., polish selectivity, of those materials may be different.

Embodiments of the present invention include shallow trench isolation (STI) structures that may be formed by etching one or more trenches into the surface of a substrate, adjacent to and in alignment with a patterned masking layer. Ions are implanted into the dielectric and/or the barrier layers used in forming the STI structure, affecting the CMP polish rate and polish selectivity of those layers. Ion implantation into the dielectric and/or barrier layers allows more uniform CMP polish rates and smoother topography for subsequent overlying insulator and conductor structures.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a substrate;
   a barrier layer over said substrate;
   a trench etched into said substrate through said barrier layer;
   a dielectric in said trench, said dielectric having a first polish rate; and
   a plurality of ions implanted into said dielectric and said barrier layer, said substrate being substantially free of said ions, said implanted dielectric having a polish higher than said first polish rate.

2. The apparatus of claim 1 wherein the dielectric comprises silicon oxide.

3. The apparatus of claim 1 wherein said dielectric is damaged by said implanted ions.

4. The apparatus of claim 1 wherein said barrier layer is formed of silicon nitride.

5. The apparatus of claim 1 wherein said ions are selected from the group consisting of silicon, carbon, nitrogen, and oxygen.

6. The apparatus of claim 1 wherein the upper surface of said barrier layer and said dielectric are coplanar.

* * * * *